(12) United States Patent
Srivastava et al.

(10) Patent No.: US 6,980,021 B1
(45) Date of Patent: Dec. 27, 2005

(54) OUTPUT BUFFER WITH TIME VARYING SOURCE IMPEDANCE FOR DRIVING CAPACITIVELY-TERMINATED TRANSMISSION LINES

(75) Inventors: Nikhil K. Srivastava, Woodland Hills, CA (US); Gopal Raghavan, Thousand Oaks, CA (US); Carl W. Pobanz, Topanga, CA (US)

(73) Assignee: Inphi Corporation, Westlake Village, CA (US)

( * ) Notice: Subject to any disclaimer, the term of this patent is extended or adjusted under 35 U.S.C. 154(b) by 27 days.

(21) Appl. No.: 10/871,459

(22) Filed: Jun. 18, 2004

(51) Int. Cl.[7] .......................... H03K 19/003
(52) U.S. Cl. ..................... 326/30; 326/21; 326/136
(58) Field of Search ........................... 326/30

(56) References Cited

U.S. PATENT DOCUMENTS 6,838,900 B2 * 1/2005 Huang et al. ................. 326/30
6,917,217 B2 * 7/2005 Herz ........................... 326/21
6,922,075 B1 * 7/2005 Morley ........................ 326/30

* cited by examiner

Primary Examiner—James H. Cho
(74) Attorney, Agent, or Firm—Koppel, Jacobs, Patrick & Heybl

(57) ABSTRACT

An output buffer for driving a capacitively-terminated transmission line produces a waveform which comprises a first portion during which the waveform transitions from a voltage V1 to a voltage V2; a second portion during which it remains fixed at V2; a third portion during which it transitions to a voltage V3; and a fourth portion during which it remains fixed at V3. The waveform is created within a unit interval whenever successive data bits transition between logic states. The first and second portions are generated with circuitry arranged such that V2 is maximized by reducing the buffer's output impedance. The fourth portion is generated with circuitry which has a non-zero output impedance preferably equal to the transmission line's characteristic impedance, to absorb transitions reflected back to the source circuitry by the capacitive termination.

29 Claims, 6 Drawing Sheets

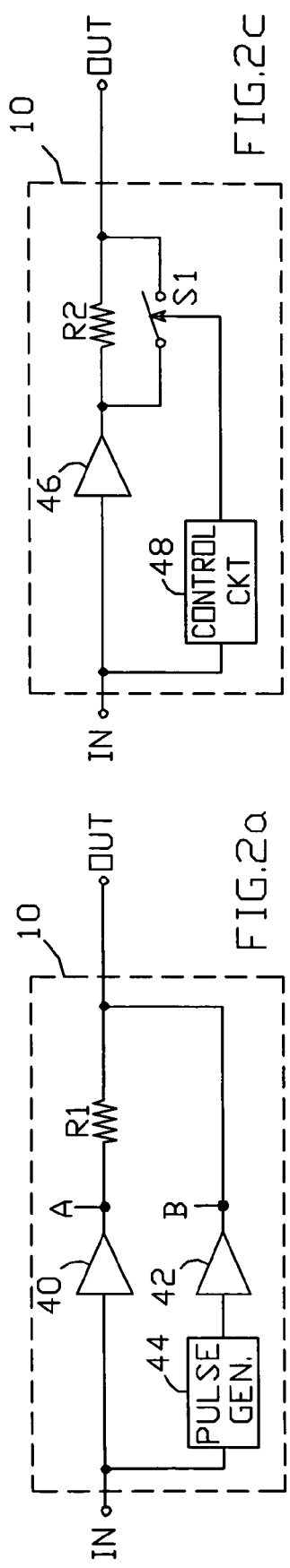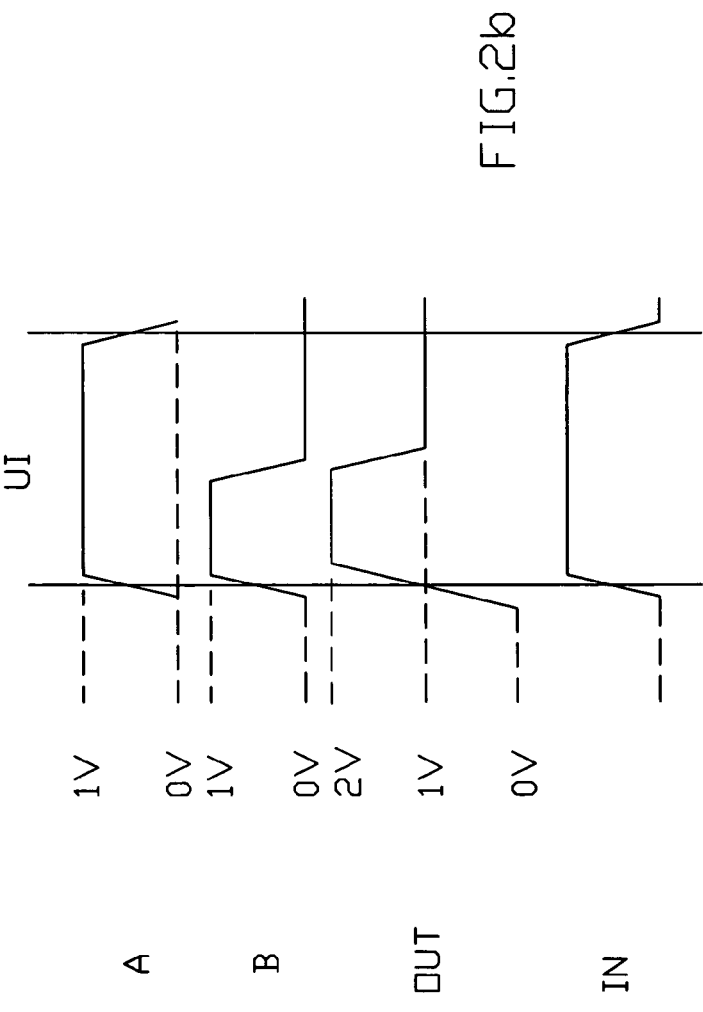

OUTPUT BUFFER WITH TIME VARYING SOURCE IMPEDANCE FOR DRIVING CAPACITIVELY-TERMINATED TRANSMISSION LINES

BACKGROUND OF THE INVENTION

1. Field of the Invention

This invention relates to the field of transmission line drivers, and particularly to circuits and methods for driving capacitively-terminated transmission lines.

2. Description of the Related Art

Transmission lines are used to convey high frequency digital data signals between a source circuit and a destination circuit. The destination circuit can be considered a load, which typically includes a capacitive component. Transmission lines having a capacitive load at their receiving end are referred to herein as capacitively-terminated transmission lines.

A transmission line has a characteristic impedance $Z_0$, as does the load being driven. Ideally, the impedances of the load and the transmission line are equal; when so arranged, a data signal transition that occurs at the source end of the transmission line is fully absorbed by the load, with none of the energy reflected back towards the source by the load. However, it is often impossible to make the transmission line and load impedances equal. For example, in digital circuits the load is often a transistor gate whose impedance is almost purely capacitive. A capacitive load causes all of the incident energy to be reflected back toward the source in a negative voltage wave. In some instances, a load resistor is added to the capacitive load in an attempt to properly terminate the transmission line. However, the capacitance at the end of the transmission line shunts out the load resistance at higher frequencies, resulting in an impedance mismatch; consequently, with a capacitive load impedance the data signal transition is at least partially reflected back towards the source. When this negative wave propagates to the source end of the transmission line, it may again be reflected back towards the load, thereby distorting the data signal being conveyed. The output impedance of the source circuit is typically much lower than $Z_0$, which allows for a large pulse amplitude to be delivered to the transmission line. This creates a fast transition slew rate at the capacitively-terminated end of the transmission line. However, a low output impedance tends to maximize the magnitude of the signal reflected by the source back towards the load, and thus the data signal distortion. The above principle is applicable to any complicated capacitively-terminated transmission line.

The problem noted above tends to become more acute as the frequency of the transitions increases; i.e., data signal distortion is less for a data bit pattern of 111000 than it is for a pattern of 101010. "Waveshaping" the data bit signal is sometimes used to mitigate this problem. One such approach requires looking ahead at a predetermined number of upcoming data bits, and increasing the amplitude of the transmitted signal when the transition frequency increases. However, this approach requires complex look-ahead and output voltage adjustment circuitry, which does nothing to reduce the magnitude of the reflected waves, or to address their causes.

SUMMARY OF THE INVENTION

An output buffer is presented which overcomes the problems noted above, providing high-speed transitions while mitigating the effects of waves reflected by a capacitive load at the terminal end of a transmission line.

The present output buffer is intended for driving a capacitively-terminated transmission line which conveys data bits via the transmission line during respective unit intervals. The buffer's output waveform comprises a first portion, during which it transitions from a first voltage V1 to a second voltage V2 between a time t1 and a time t2; a second portion during which it remains fixed at V2 until a time t3; a third portion during which it transitions to a voltage V3 between V1 and V2 between time t3 and a time t4; and a fourth portion during which it remains fixed at V3 until a time t5. The output buffer waveform is created within a unit interval whenever successive data bits transition between logic states—i.e., when a "1" is followed by a "0", or a "0" is followed by a "1".

The invention requires that the output buffer generate the first and second portions of the waveform with circuitry having an output impedance $Z_1$ much lower than the characteristic impedance $Z_0$ of the transmission line such that voltage V3 is maximized. The invention further requires that the fourth output buffer waveform portion be generated with output buffer circuitry which has a non-zero output impedance $Z_2$, greater than $Z_1$ and preferably equal to $Z_0$, to absorb transitions reflected back to the source circuitry by the capacitive termination.

The low-Z source impedance during the first and second waveform portions increases the initial voltage delivered into the transmission line (when compared with a standard $Z_0$ source impedance), thereby causing the capacitive load to receive a larger incident pulse such that it is quickly charged, which increases the slew rate at the capacitive load. To mitigate the effect of the wave reflected by the load, the duration of the first and second portions is preferably made less than the twice the data bit's transit time on the transmission line, such that the output impedance $Z_2$ (preferably=$Z_0$) associated with the fourth portion is in place to absorb and/or dissipate the reflected wave and thereby reduce the data signal distortion that might otherwise occur. Overshoot and undershoot problems are also reduced, as the absorption of the reflected wave by $Z_2$ and the lower voltage fourth waveform portion tend to reduce the magnitude of any ringing on the transmission line.

Further features and advantages of the invention will be apparent to those skilled in the art from the following detailed description, taken together with the accompanying drawings.

BRIEF DESCRIPTION OF THE DRAWINGS

FIG. 2a is one possible embodiment of an output buffer per the present invention.

FIG. 2b is a timing diagram illustrating the operation of the output buffer shown in FIG. 2a.

FIG. 2c is another possible embodiment of an output buffer per the present invention.

FIG. 3a is an n branch embodiment of the output buffer shown in FIG. 2a.

DETAILED DESCRIPTION OF THE INVENTION

Figure 1A:
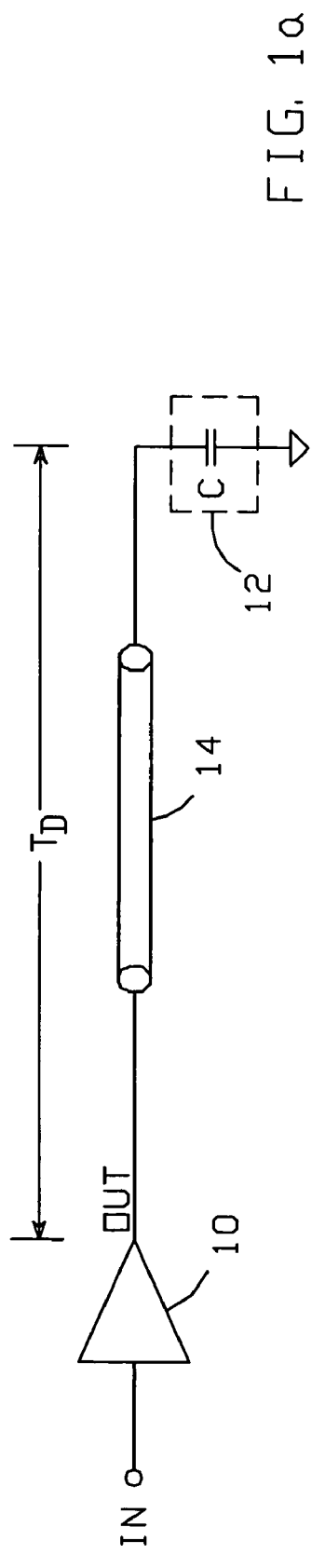
FIG. 1a is a diagram of an output buffer and capacitively-terminated transmission line per the present invention.

The present output buffer is intended for driving a capacitively-terminated transmission line as illustrated in FIG. 1a. An output buffer 10 generates a high speed data signal at an output OUT in response to an input signal received at an input terminal IN; the data signal is conveyed to a load 12 via a transmission line 14. Load 12 can be any manner of circuit; for example, a memory cell's address circuitry. The load driven by the data signal includes a capacitive component, such that transmission line 14 is said to be "capacitively-terminated"; in FIG. 1a, the capacitive component of the load is represented as a capacitor C.

As noted above, a capacitively-terminated transmission line suffers from several problems, including data signal distortion that arises due to data signal transitions which are reflected by load 12 towards source 10, and back again towards the load. Also, an output buffer 10 having a low output impedance provides fast data signal transitions at the load (as compared to an impedance-matched source), but the low output impedance tends to maximize the magnitude of the wave reflected back towards the load.

The present invention overcomes these problems by several means. The data signal is conveyed to load 12 using an output buffer which produces a waveform that has been "shaped" to have particular characteristics; an exemplary output buffer waveform is shown in FIG. 1b. The waveform is specifically designed for driving a capacitively-terminated transmission line which conveys data bits during respective "unit intervals" (UIs); a UI is commonly defined as the time interval allotted for a single data bit. Two UIs are shown in FIG. 1b, with the data bit in the first UI (20) being a logic "1" and the data bit in the second UI (22) being a logic "0". With respect to UI 20, the output buffer waveform comprises:

- a first portion 24 during which the waveform transitions from a first voltage to a second voltage between a time t1 and a time t2. In UI 20, the waveform is shown transitioning between a first voltage "1V" and a second voltage "3V"; note that these voltage levels are merely exemplary.
- a second portion 26 during which the waveform remains fixed at the second voltage (3V) until a time t3;
- a third portion 28 during which the waveform transitions to a voltage (2V) between the first and second voltages between time t3 and a time t4; and
- a fourth portion 30 during which the waveform remains fixed at the third voltage (2V) until a time t5.

The waveform for a "0" data bit, shown in UI 22, is an inverted version of the waveform for a "1" data bit.

The present output buffer generates the waveform described above within a UI whenever successive data bits transition between logic states; that is, when there is a transition between a "0" and a "1" (as in UI 20), or when there is a transition between a "1" and a "0" (as in UI 22).

The output buffer is arranged such that first output buffer waveform portions 24 and 26 are generated with circuitry having an output impedance $Z_1$ which is much lower than the characteristic impedance $Z_0$ of transmission line 14, thereby enabling the initial amplitude of the output waveform (26) to be maximized. The low-Z source impedance during the first and second waveform portions increases the initial voltage delivered into the transmission line (when compared with a standard $Z_0$ source impedance), thereby causing the capacitive load to receive a larger incident pulse such that it is quickly charged, which increases the slew rate at the capacitive load. Then, the output buffer is arranged such that the fourth output buffer waveform portion (30) is generated with circuitry which has a non-zero output impedance $Z_2$, which is greater than $Z_1$ and preferably equal to $Z_0$, such that the generating circuitry acts as a back termination which absorbs and/or dissipates transitions reflected back to the generating circuitry by the capacitive termination. $Z_2$ is preferably made equal to $Z_0$ to maximize the extent to which reflected transitions are absorbed, thereby reducing data signal distortion that might otherwise occur.

The amplitude of waveform portion 26 is made higher than that of waveform portion 30; this puts a high amount of energy into transmission line 14 such that capacitance C is quickly charged. This enables a fast data bit transition at the load, while substantially reducing re-reflection (by the source) of the negative voltage waves reflected by the capacitive load. Such "second order" reflections could cause severe ringing and voltage overshoot exceeding even 100% of the incident wave amplitude.

The time required for a data bit to propagate from output buffer 10 to load 12 is identified in FIG. 1a as time $T_d$. The present output buffer is preferably arranged such that the duration of the first and second waveform portions (i.e., t3−t1) is less than $2*T_d$. This tends to reduce the adverse impact on data signal distortion caused by the wave reflected by capacitive load 12.

A transmission line includes an inherent inductive component. As such, the transmission line tends to appear as an underdamped system to a data signal source, such that a data bit transition can exhibit overshoot, undershoot, and/or ringing at the load end of the transmission line. The lower amplitude of portion 30 of the present waveform tends to reduce the magnitude of such overshoot. In addition, the non-zero output impedance of the output buffer during portion 30 ($Z_2$) tends to further dampen any ringing.

As described above, several factors should be considered when determining the voltage levels and durations for the various portions of the present waveform. In determining the voltage levels (V, 2V, 3V) of the waveform portions, consideration should be given to the losses incurred on the transmission line, the need to control a transitioning signal's overshoot/undershoot, and the need to quickly charge the transmission line's capacitive termination. As noted above, the time duration (t3−t1) should be less than $2*T_d$. The duration and amplitude of the first and second waveform portions (t1 to t3) should be made as narrow and high as possible, respectively (within the power limits of the generating circuitry) to reduce ringing, while at the same time having a duration long enough to impart sufficient energy to fully charge the capacitor at the load end of transmission line 14.

Figure 1C:
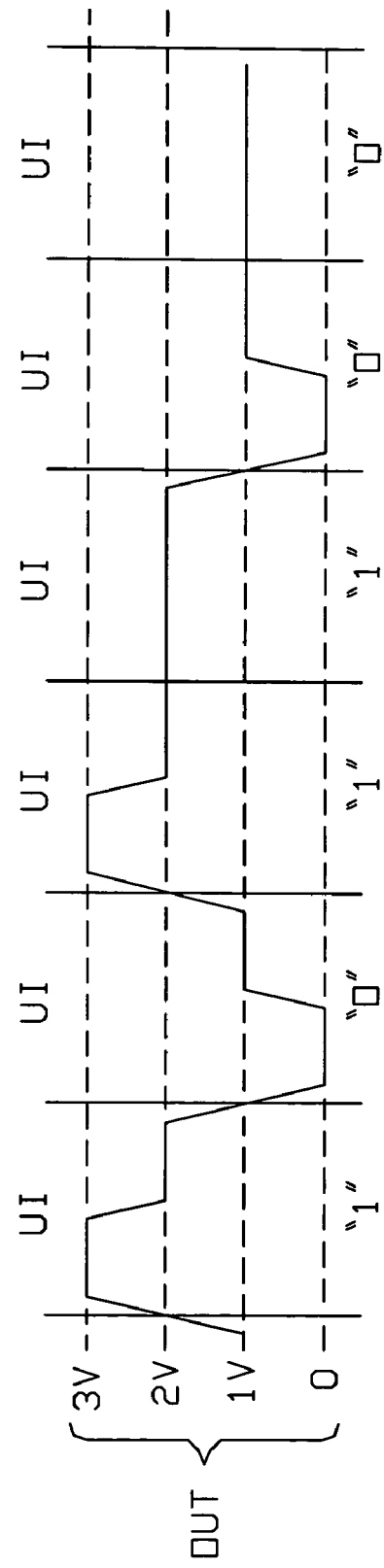
FIG. 1c is a timing diagram showing the transmission of several successive data bits in accordance with the present invention.
Figure 1B:
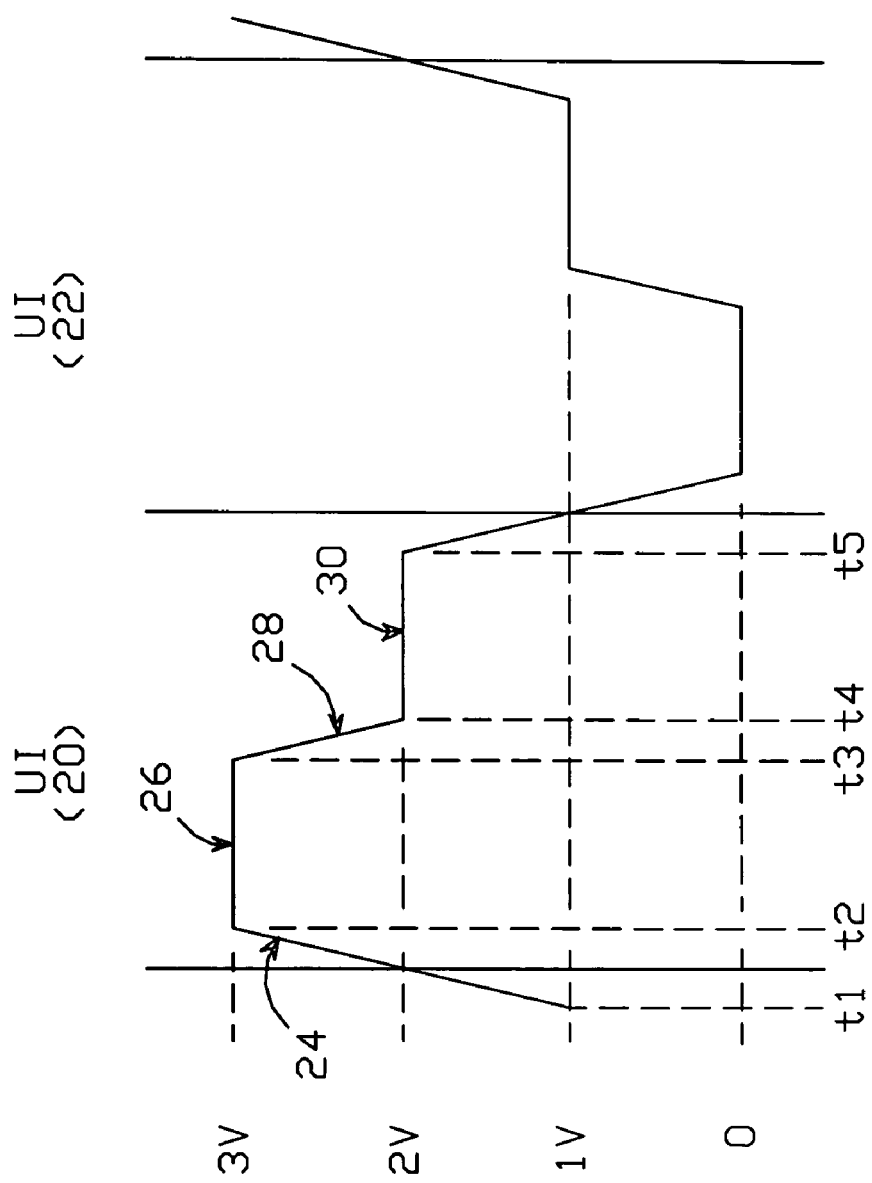
FIG. 1b is a timing diagram for an output buffer waveform in accordance with the present invention.

The timing diagram in FIG. 1c illustrates the output generated by buffer 10 for a data bit pattern of "101100". Note that the present invention's waveshaping is only employed when there is a transition. Whenever there is a transition, the waveform produced by the present output buffer is generated within a UI, to aid in launching the transition and to absorb/dissipate the reflected energy. However, for repeated bits such as the "11" or "00" patterns in FIG. 1c, there is no transition within the UI and thus no reflected transition; therefore, there is no need to employ the present waveform in these UIs. In fact, for repeated bits, the lower amplitude incident voltage (e.g., 2V for a "1" or 1V for a "0") is sufficient to accurately convey the logic state, since the load capacitor is already charged to its final value and appears as an open circuit to the transmission line. The buffer is therefore power efficient as well as fast.

An output buffer 10 capable of producing the present waveform might be implemented in a number of different ways. One possible embodiment is shown in FIG. 2a. Here, a first buffer stage 40 and a second buffer stage 42 are employed to produce the present output buffer waveform. Buffer stage 40 receives the input signal and provides an output signal to output terminal OUT via a series resistance R1. Buffer stage 42 receives its input from a pulse generator 44, which receives the input signal and produces an output pulse having a predetermined width; buffer stage 42 tracks this pulse to provide an output signal to output terminal OUT. There is no series resistance between OUT and buffer stage 42, which preferably has a very low output impedance.

A timing diagram illustrating the operation of this output buffer in response to a transitioning input signal is shown in FIG. 2b. A transitioning input signal is received at input terminal IN. In response, buffer stage 40 produces an output (trace "A") which tracks the input signal, transitioning between voltage levels 0V and 1V. Output A is provided to output terminal A via series resistance R1. Pulse generator 44 responds to the transitioning input signal by providing a pulse of predetermined width (<2*Td) to buffer stage 42, which produces an output (trace "B") which tracks the pulse; this output also transitions between voltage levels 0V and 1V (in this example). The two waveforms are summed at output terminal OUT to produce the final output buffer waveform per the present invention.

When so arranged, both buffer stages are active and contribute to the first (transition) and second (high plateau) portions of the final waveform. Having both stages active provides a large drive strength, and the very low output impedance of buffer stage 42 gives the first portion of the final waveform a fast transition to a large amplitude at the capacitive load. At the termination of the pulse produced by pulse generator 44, the output of buffer stage 42 is reduced (or goes to zero) and its output impedance is preferably increased to a high value, and the output buffer waveform is provided primarily or entirely by buffer stage 40 via R1. This reduces the amplitude of the output buffer waveform (to 1V in this example), and provides the non-zero output impedance for waveform portion 4 required by the invention. As noted above, R1 is preferably set equal to the characteristic impedance of the transmission line driven by the output buffer waveform. In this exemplary implementation, pulse generator 44 establishes time duration (t3−t1).

Another possible implementation of output buffer 10 is shown in FIG. 2c. Here, a single buffer stage 46 receives the input signal and provides an output signal to output terminal OUT via a series resistance R2. A switch S1 is connected across R2; S1 is controlled with a control circuit 48 that also receives the input signal. In operation, the output of buffer stage 46 tracks the input signal. To generate the first and second portions of the present output buffer waveform, control circuit 48 closes switch S1 at the start of a data bit transition such that the output of buffer stage 46 bypasses R2—thereby providing the necessary very low output impedance. Switch S1 is kept closed for a predetermined duration, and is then opened—which inserts series resistance R2 between buffer stage 46 and OUT. This provides the non-zero output impedance for waveform portion 4 required by the invention. Here, control circuit 48 establishes time duration (t3−t1).

Figure 3A:
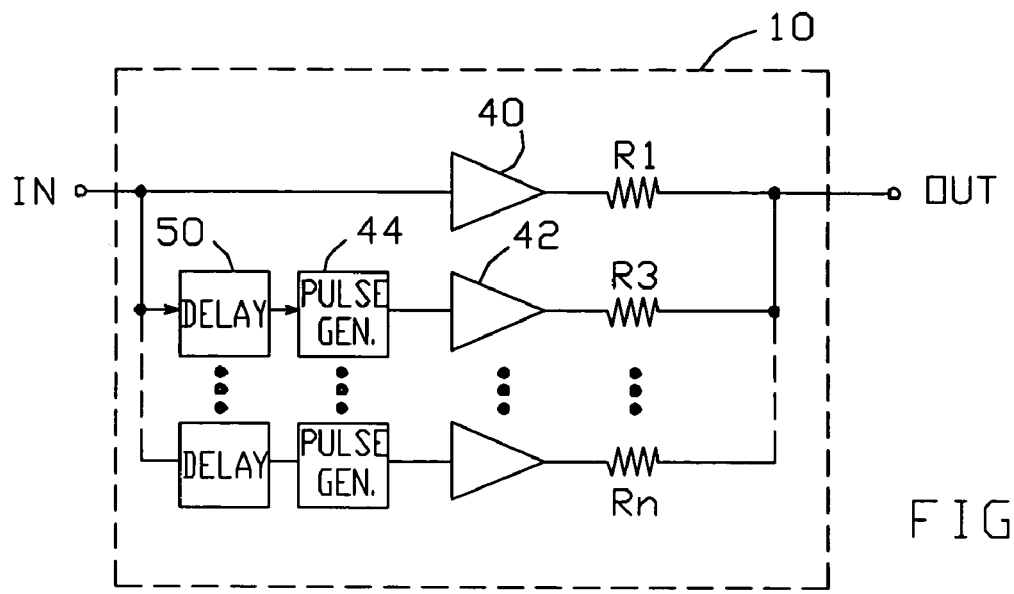

The exemplary implementations should in FIGS. 2a and 2c can be extended to n dimensions, to provide additional control over the resulting output waveform. In FIG. 3a, for example, output buffer 10 includes first and second branches containing buffer stages 40 and 42, respectively, as in FIG. 2a. Here, a delay block 50 is preferably connected prior to pulse generator 44, to control the instant at which the output of buffer stage 42 transitions. Additional branches similar to the second branch could be connected in parallel with the first two branches, with the outputs of all n branches summed together at output terminal OUT, to provide additional control over the shape of the output buffer waveform. Note that the values of series resistors R3, . . . ,Rn could have values from zero to infinity—i.e., implemented with a short circuit (zero), with an open circuit (infinity), or with a finite, non-zero resistance—as needed to meet the requirements of a particular application.

Figure 3B:
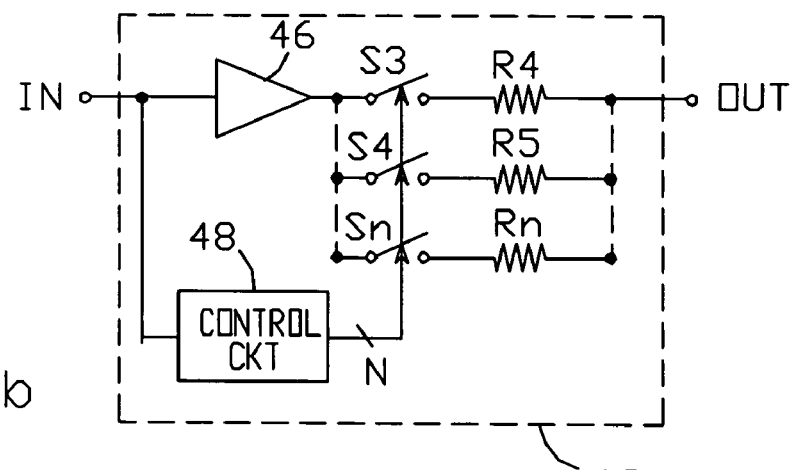
FIG. 3b is an n branch embodiment of the output buffer shown in FIG. 2c.

Similarly, FIG. 3b is somewhat similar to the implementation shown in FIG. 2c: output buffer 10 includes a buffer stage 46, and a resistor R4 and a switch S2 are connected between the output of stage 46 and output terminal OUT. Here, however, R4 and S2 are connected in series. Additional switch/resistor branches can be connected in parallel with S3 and R4, with the outputs of all n branches summed together at output terminal OUT. Control circuit could be arranged to operates the switches to introduce unique delays into each branch, to provide additional control over the shape of the output buffer waveform. As in FIG. 3a, the values of resistors R4, . . . ,Rn are allowed to have values from zero to infinity, as needed to meet the requirements of a particular application.

Figure 3C:
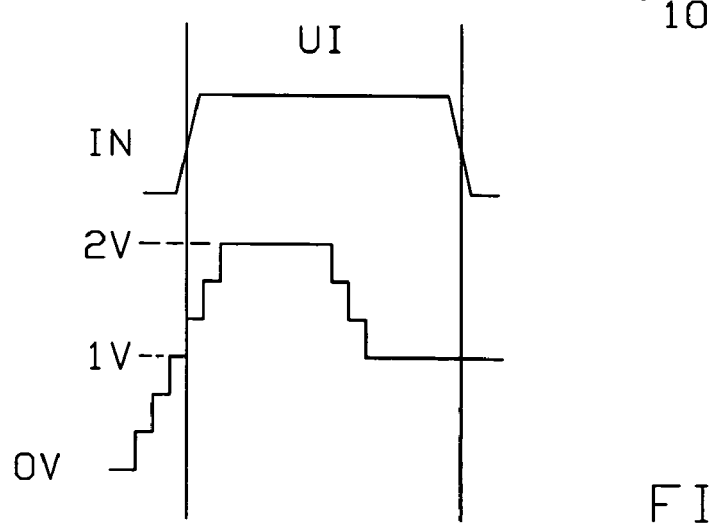
FIG. 3c is a timing diagram illustrating the operation of the output buffers shown in FIGS. 3a and 3b.

A timing diagram illustrating one possible output buffer waveform that could result from the implementations shown in FIGS. 3a and 3b is shown in FIG. 3c. With the respective branch delays appropriately set, staircase-shaped transitions can be achieved for the waveforms rising and falling edges at the transmit side. This staircase waveform is smoothed out at the receive end due to the low pass filtering done by the capacitive load.

Many other output buffer circuits could be realized; those shown in FIGS. 2a, 2c, 3a and 3b are merely exemplary. It is only essential that the circuit be capable of generating an output buffer waveform within a unit interval whenever successive data bits transition between logic states, having a first (transition) portion in which the amplitude of the incident wave is quickly increased by reducing the source impedance, a second portion during which the waveform remains at a fixed voltage, a third portion during which the waveform transitions to an intermediate voltage, and a fourth portion during which the waveform remains at a fixed intermediate voltage, with the fourth portion generated with circuitry which has a non-zero output impedance to absorb transitions reflected back to the generating circuitry by the transmission line's capacitive termination.

Figure 4A:
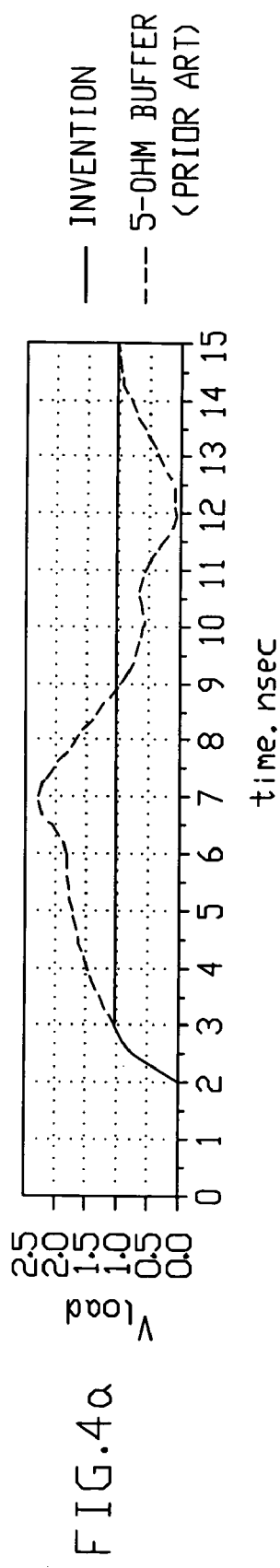
FIG. 4a is a timing diagram comparing the results achievable by the present output buffer with a prior art buffer having a low output impedance.
Figure 4B:
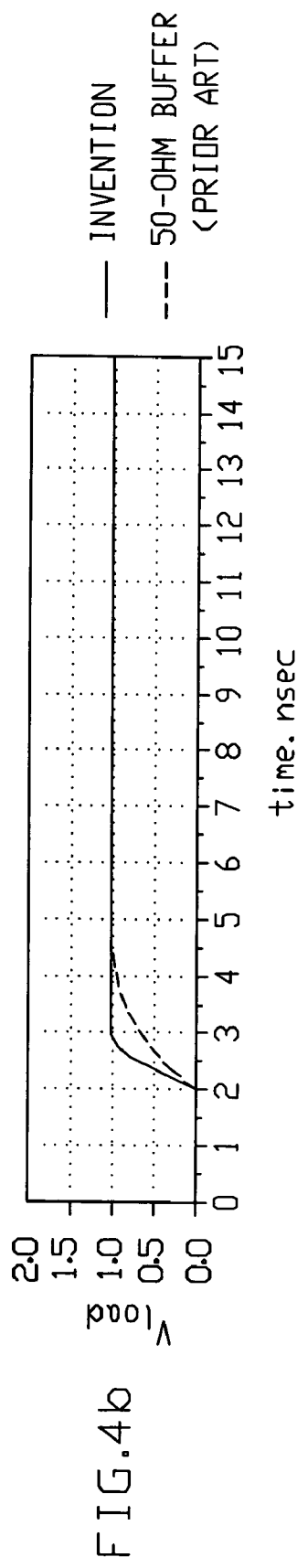
FIG. 4b is a timing diagram comparing the results achievable by the present output buffer with a prior art buffer having a standard output impedance.
Figure 4C:
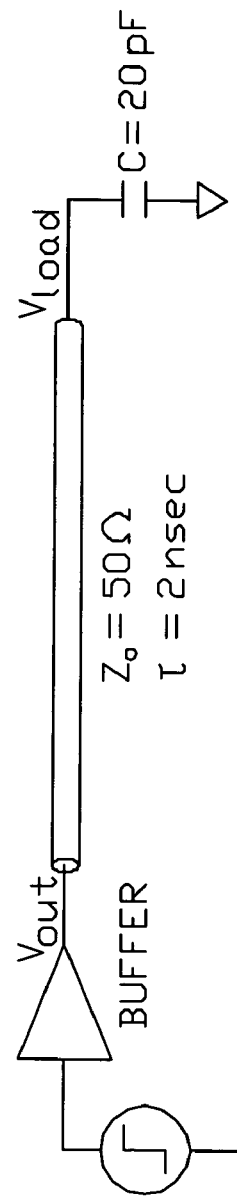
FIG. 4c is a diagram illustrating the circuit conditions applicable to the results shown in FIGS. 4a and 4b.

FIGS. 4a and 4b illustrate typical results that can be achieved using the present output buffer. In each of these examples, at each bit transition the present buffer exhibits a low (5 Ω) source impedance for a period equal to the time constant of the capacitive load ($C*Z_0$)—which is less than a bit period—after which time it presents an impedance matched ($Z_0$) output. FIG. 4a depicts an output waveform as seen at the load end of a transmission line driven by the present buffer, in comparison with a typical output waveform from a prior art buffer having a low (5 Ω) output impedance. Both waveforms exhibit a fast slew rate, as both employ a low source impedance; however, the invention substantially reduces the overshoot and undershoot evident in the prior art waveform. FIG. 4b depicts an output waveform as seen at the load end of the transmission line driven by the present buffer, in comparison with a typical output waveform from a prior art buffer having a standard output impedance (e.g. matched to the transmission line $Z_0$, 50 Ω). Here, neither waveform exhibits overshoot or undershoot, but the slew rate of the prior art waveform is considerably slower. The circuit conditions applicable to FIGS. 4a and 4b are shown in FIG. 4c.

Figure 5:
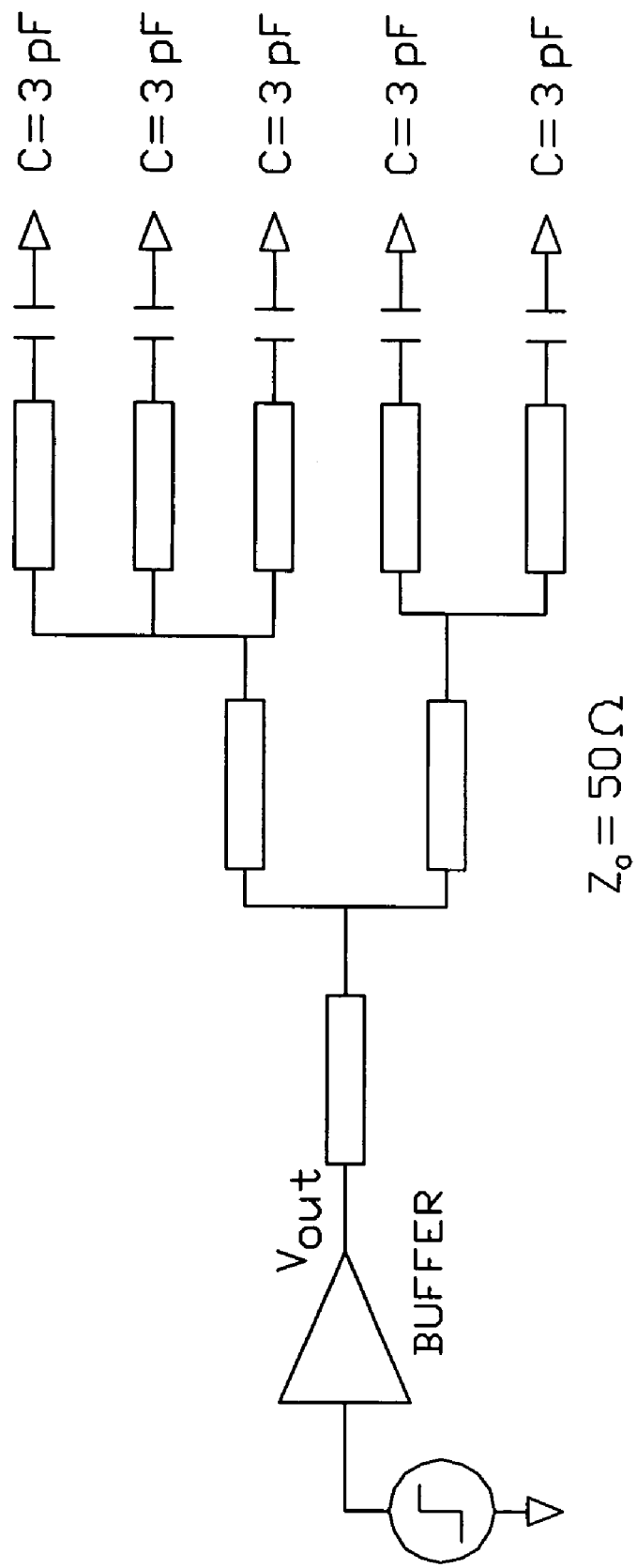
FIG. 5 is a diagram illustrating a complex transmission line network as might be driven by the present output buffer.

Note that though the discussion above has focused on the driving of a single transmission line terminated with a single capacitive load, the invention is generally applicable to any transmission line or transmission line network, which can include numerous capacitive loads. An exemplary complex transmission line network which might be driven by the present output buffer is shown in FIG. 5.

While particular embodiments of the invention have been shown and described, numerous variations and alternate embodiments will occur to those skilled in the art. Accordingly, it is intended that the invention be limited only in terms of the appended claims.

We claim:

1. An output buffer for driving a capacitively-terminated transmission line having a characteristic impedance $Z_0$ and which conveys data bits during respective unit intervals, said output buffer arranged to generate a waveform which varies with said data bits, said waveform comprising:
    a first portion during which said waveform transitions from a first voltage V1 to a second voltage V2 between a time t1 and a time t2;
    a second portion during which said waveform remains fixed at said second voltage V2 until a time t3;
    a third portion during which said waveform transitions to a voltage V3 between V1 and V2 between time t3 and a time t4; and
    a fourth portion during which said waveform remains fixed at said third voltage V3 until a time t5;
    said output buffer arranged to generate said waveform within a unit interval whenever successive data bits transition from a first logic state to a second logic state;
    said output buffer arranged to have an output impedance $Z_1$ much less than $Z_0$ when generating said first and second output buffer waveform portions such that voltage V2 is maximized, and arranged to have a non-zero output impedance $Z_2$ greater than $Z_1$ when generating said fourth output buffer waveform portion to absorb transitions reflected back to said buffer by said capacitive termination.

2. The output buffer of claim 1, wherein said buffer is arranged such that $Z_2$ is approximately equal to $Z_0$.

3. The output buffer of claim 1, wherein said output buffer comprises:
    a first buffer circuit having an output impedance of nearly zero which is arranged to, in response to an input signal which varies with said data bits, generate a first component of said first and second waveform portions; and
    a second buffer circuit having said non-zero output impedance and which is arranged to, in response to said input signal, generate a second component of said first and second waveform portions and to generate said third and fourth waveform portions;
    the outputs of said first and second buffer circuits summed together to create said output buffer waveform.

4. The output buffer of claim 3, wherein said first buffer circuit comprises:
    a pulse generator which receives said input signal and outputs a pulse of predetermined duration whenever successive data bits transition between logic states; and
    a buffer stage which receives said pulse and tracks said pulse to generate said first component of said first and second waveform portions.

5. The output buffer of claim 3, wherein said second buffer circuit comprises:
    a buffer stage which receives and tracks said input signal to output said second component of said first and second waveform portions and said third and fourth waveform portions; and
    a resistor connected in series with said buffer stage output to provide said non-zero output impedance.

6. The output buffer of claim 5, wherein said resistor connected in series has an impedance which is approximately equal to $Z_0$.

7. The output buffer of claim 1, wherein said output buffer comprises:
    a buffer stage having an output impedance of nearly zero and arranged to generate said first, second, third and fourth portions of said waveform;
    a resistor connected in series with the output of said buffer stage;
    a switch connected across said resistor which is operated in response to a control signal; and
    a control circuit arranged to close said switch and thereby provide a conductive path around said resistor during the generation of said first output buffer waveform portion, and arranged to open said switch and thereby insert said resistor in series with the output of said buffer stage during the generation of said fourth output buffer waveform portion to provide said non-zero output impedance.

8. The output buffer of claim 7, wherein said resistor connected in series has an impedance which is approximately equal to $Z_0$.

9. The output buffer of claim 1, wherein said data bits are conveyed from said output buffer to said capacitive termination in a time $T_d$, said waveform arranged such that the time duration (t3–t1) is less than $2*T_d$.

10. The output buffer of claim 1, wherein said output buffer comprises:
    a first buffer circuit, comprising:
        a first buffer stage which receives and tracks said input signal to output a component of said first and second waveform portions and said third and fourth waveform portions; and
        a resistor connected in series with said buffer stage output to provide said non-zero output impedance; and
    a plurality of additional buffer circuits connected in parallel with said first buffer circuit, each of said additional buffer circuits comprising:
        a delay circuit which receives and delays said input signal for a predetermined time period;
        a pulse generator which receives said delayed input signal and outputs a pulse of predetermined duration whenever successive data bits transition between logic states;

a buffer stage which receives said pulse and tracks said pulse to generate said a component of said first and second waveform portions; and a resistor connected in series with said buffer stage output;

the outputs of said first and second buffer circuits summed together to create said output buffer waveform.

11. The output buffer of claim 10, wherein each of said additional buffer circuits' resistors could be implemented with a short circuit, with an open circuit, or with a finite, non-zero resistance.

12. The output buffer of claim 10, wherein said additional buffer circuits are arranged such that said first waveform portion increases from V1 to V2 in a staircase pattern, and said third waveform portion decreases from V2 to V3 in a staircase pattern.

13. The output buffer of claim 1, wherein said output buffer comprises:
a buffer stage having an output impedance of nearly zero and arranged to generate said first, second, third and fourth portions of said waveform;
a first switch which is operated in response to a control signal and a first resistor connected in series with the output of said buffer stage;
a plurality of additional switches which are operated in response to respective control signals connected in series with respective additional resistors, each switch/resistor pair connected in parallel with said first switch and first resistor; and
a control circuit arranged to provide said control signals to said switches and arranged to close said switches as required to achieve a desired output buffer waveform.

14. The output buffer of claim 13, wherein each of said resistors could be implemented with a short circuit, with an open circuit, or with a finite, non-zero resistance.

15. The output buffer of claim 1, said output buffer further arranged such that, when generating said first output buffer waveform portion, said second voltage V2 is maximized.

16. An output buffer waveform for driving a capacitively-terminated transmission line having a characteristic impedance $Z_0$ and which conveys data bits during respective unit intervals, said waveform comprising:
a first portion during which said waveform transitions between a first voltage V1 and a second voltage V2 between a time t1 and a time t2;
a second portion during which said waveform remains fixed at said second voltage V2 until a time t3;
a third portion during which said waveform transitions to a voltage V3 between V1 and V2 between time t3 and a time t4; and
a fourth portion during which said waveform remains fixed at said third voltage V3 until a time t5;
said output buffer waveform created within a unit interval whenever successive data bits transition between logic states;
said first and second output buffer waveform portions generated with circuitry arranged such that voltage V2 is maximized, and said fourth output buffer waveform portion generated with circuitry which has a non-zero output impedance to absorb transitions reflected back to said circuitry by said capacitive termination.

17. The output buffer waveform of claim 16, wherein said transmission line has a characteristic impedance, said circuitry arranged such that said non-zero output impedance is approximately equal to said characteristic impedance.

18. The output buffer waveform of claim 16, wherein said circuitry comprises:
a first buffer circuit having a low output impedance which is arranged to, in response to an input signal which varies with said data bits, generate a first component of said first and second waveform portions; and
a second buffer circuit having said non-zero output impedance and which is arranged to, in response to said input signal, generate a second component of said first and second waveform portions and to generate said third and fourth waveform portions;
the outputs of said first and second buffer circuits summed together to create said output buffer waveform.

19. The output buffer waveform of claim 18, wherein said first buffer circuit comprises:
a pulse generator which receives said input signal and outputs a pulse of predetermined duration whenever successive data bits transition between logic states; and
a buffer stage which receives said pulse and tracks said pulse to generate said first component of said first and second waveform portions.

20. The output buffer waveform of claim 18, wherein said second buffer circuit comprises:
a buffer stage which receives and tracks said input signal to output said second component of said first and second waveform portions and said third and fourth waveform portions; and
a resistor connected in series with said buffer stage output to provide said non-zero output impedance.

21. The output buffer waveform of claim 16, wherein said circuitry comprises:
a buffer stage having an output impedance of nearly zero and arranged to generate said first, second, third and fourth portions of said waveform;
a resistor connected in series with the output of said buffer stage;
a switch connected across said resistor which is operated in response to a control signal; and
a control circuit arranged to close said switch and thereby provide a conductive path around said resistor during the generation of said first output buffer waveform portion, and arranged to open said switch and thereby insert said resistor in series with the output of said buffer stage during the generation of said fourth output buffer waveform portion to provide said non-zero output impedance.

22. The output buffer waveform of claim 21, wherein said transmission line has a characteristic impedance, said resistor connected in series having an impedance which is approximately equal to said characteristic impedance.

23. The output buffer waveform of claim 16, wherein said data bits are conveyed from said circuitry to said capacitive termination in a time $T_d$, said waveform arranged such that the time duration (t3−t1) is less than $2*T_d$.

24. The output buffer waveform of claim 16, wherein said first and third waveform portions are generated by summing the outputs of multiple circuits arranged such that said first waveform portion increases from V1 to V2 in a staircase pattern, and said third waveform portion decreases from V2 to V3 in a staircase pattern.

25. A method of driving a capacitively-terminated transmission line having a characteristic impedance $Z_0$ which conveys data bits during respective unit intervals, comprising:

generating a waveform which varies with said data bits within a unit interval whenever successive data bits transition between logic states, said waveform generation comprising:

generating, using a source having an output impedance $Z_1$ which is much less than $Z_0$, a first portion of said waveform during which said waveform transitions from a first voltage V1 to a second voltage V2 between a time t1 and a time t2;

generating, using a source having an output impedance $Z_1$ which is much less than $Z_0$, a second portion of said waveform during which said waveform remains fixed at said second voltage V2 until a time t3;

generating a third portion of said waveform during which said waveform transitions to a voltage V3 between V1 and V2 between time t3 and a time t4; and generating, using a source having a non-zero output impedance $Z_2$ greater than $Z_1$, a fourth portion of said waveform during which said waveform remains fixed at said third voltage V3 until a time t5.

26. The method of claim 25, wherein said non-zero output impedance is approximately equal to $Z_0$.

27. The method of claim 25, wherein said data bits are conveyed to said capacitive termination in a time $T_d$, said waveform arranged such that the time duration (t3−t1) is less than $2*T_d$.

28. The method of claim 25, wherein said first and third waveform portions are generated by summing the outputs of multiple circuits arranged such that said first waveform portion increases from V1 to V2 in a staircase pattern, and said third waveform portion decreases from V2 to V3 in a staircase pattern.

29. The method of claim 25, wherein said step of generating said first portion of said waveform further comprises maximizing said second voltage V2.

* * * * *